(12) United States Patent
Srivastava et al.

(10) Patent No.: US 8,932,430 B2
(45) Date of Patent: Jan. 13, 2015

(54) RF COUPLED PLASMA ABATEMENT SYSTEM COMPRISING AN INTEGRATED POWER OSCILLATOR

(75) Inventors: Aseem K. Srivastava, Andover, MA (US); William F. DiVergilio, Cambridge, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 836 days.

(21) Appl. No.: 13/102,206

(22) Filed: May 6, 2011

(65) Prior Publication Data

US 2012/0279657 A1    Nov. 8, 2012

(51) Int. Cl.

| | |
|---|---|
| *C23C 16/50* | (2006.01) |
| *C23C 16/503* | (2006.01) |
| *C23C 16/505* | (2006.01) |
| *C23C 16/507* | (2006.01) |
| *C23C 16/52* | (2006.01) |
| *H01L 21/306* | (2006.01) |
| *C23F 1/00* | (2006.01) |
| *A61H 35/00* | (2006.01) |
| *C23C 16/44* | (2006.01) |
| *H01J 37/32* | (2006.01) |
| *C23C 16/06* | (2006.01) |
| *C23C 16/22* | (2006.01) |

(52) U.S. Cl.
CPC .......... *A61H 35/006* (2013.01); *C23C 16/4412* (2013.01); *H01J 37/32844* (2013.01); *C23C 16/4401* (2013.01); *C23C 16/50* (2013.01); *Y02C 20/30* (2013.01)
USPC ............ 156/345.48; 156/345.24; 156/345.28; 118/723 I; 118/723 R

(58) Field of Classification Search
USPC ......... 156/345.48, 345.24, 345.28; 118/723 I, 118/723 IR
See application file for complete search history.

(56) References Cited

U.S. PATENT DOCUMENTS

| | | | | |
|---|---|---|---|---|
| 2,745,018 | A | * | 5/1956 | Baker et al. .................. 250/295 |
| 3,635,811 | A | * | 1/1972 | Lane ....................... 204/192.15 |
| 3,832,648 | A | | 8/1974 | McDowell |
| 3,958,883 | A | | 5/1976 | Turner |
| 4,629,887 | A | * | 12/1986 | Bernier ......................... 250/251 |

(Continued)

OTHER PUBLICATIONS

Notice of Allowance dated Jul. 27, 2001 in connection with U.S. Appl. No. 09/619,839.

(Continued)

*Primary Examiner* — Rudy Zervigon
(74) *Attorney, Agent, or Firm* — Eschweiler & Associates, LLC

(57) ABSTRACT

The present disclosure is directed towards a method and apparatus for generating an abatement plasma downstream of a processing chamber using an RF plasma ignited and sustained with an integrated power oscillator circuit driven by feedback based upon a load of the abatement plasma. In one embodiment, a plasma ashing system includes an abatement system configured to receive an effluent byproduct from an upstream processing chamber containing a workpiece. The effluent byproduct is provided along an exhaust conduit to a downstream afterburner unit having an integrated power oscillator, that relies upon an oscillating circuit operatively coupled to an antenna to ignite the abatement plasma within the exhaust conduit. The antenna, together with the plasma load, form a resonant tank circuit, which provides a feedback that drives operation of the oscillating circuit, thereby allowing the oscillating circuit to vary its output based upon changes in the abatement plasma load.

18 Claims, 6 Drawing Sheets

(56) References Cited

U.S. PATENT DOCUMENTS

| | | | |
|---|---|---|---|
| 5,137,701 A * | 8/1992 | Mundt | 423/210 |
| 5,212,425 A | 5/1993 | Goebel et al. | |
| 5,556,549 A * | 9/1996 | Patrick et al. | 216/61 |
| 5,643,364 A | 7/1997 | Zhao et al. | |
| 5,862,057 A * | 1/1999 | Xia et al. | 716/50 |
| 5,911,832 A | 6/1999 | Denholm et al. | |
| 5,942,855 A | 8/1999 | Hopwood | |
| 6,045,618 A * | 4/2000 | Raoux et al. | 118/715 |
| 6,174,450 B1 * | 1/2001 | Patrick et al. | 216/61 |
| 6,305,316 B1 * | 10/2001 | DiVergilio et al. | 118/723 I |
| 6,329,297 B1 * | 12/2001 | Balish et al. | 438/714 |
| 6,348,099 B1 * | 2/2002 | Xia et al. | 118/697 |
| 6,422,172 B1 * | 7/2002 | Tanaka et al. | 118/723 R |
| 6,449,568 B1 * | 9/2002 | Gerrish | 702/60 |
| 6,454,898 B1 * | 9/2002 | Collins et al. | 156/345.1 |
| 6,592,710 B1 * | 7/2003 | Benjamin et al. | 156/345.48 |
| 6,610,169 B2 * | 8/2003 | Nguyen et al. | 156/345.38 |
| 6,740,842 B2 * | 5/2004 | Johnson et al. | 219/121.54 |
| 6,853,141 B2 * | 2/2005 | Hoffman et al. | 315/111.21 |
| 6,887,339 B1 * | 5/2005 | Goodman et al. | 156/345.28 |
| 6,899,817 B1 * | 5/2005 | Becker et al. | 216/70 |
| 6,939,434 B2 * | 9/2005 | Collins et al. | 156/345.35 |
| 7,567,037 B2 * | 7/2009 | Setsuhara et al. | 315/111.21 |
| 7,764,140 B2 * | 7/2010 | Nagarkatti et al. | 333/17.3 |
| 2002/0125223 A1 * | 9/2002 | Johnson et al. | 219/121.43 |
| 2003/0164225 A1 * | 9/2003 | Sawayama et al. | 156/345.29 |
| 2004/0163590 A1 * | 8/2004 | Tran et al. | 118/715 |
| 2010/0055807 A1 | 3/2010 | Srivastava et al. | |
| 2012/0279657 A1 * | 11/2012 | Srivastava et al. | 156/345.29 |

OTHER PUBLICATIONS

Office Action dated Mar. 19, 2001 in connection with U.S. Appl. No. 09/619,839.

U.S. Appl. No. 09/619,839, filed Jul. 20, 2000.

* cited by examiner

RF COUPLED PLASMA ABATEMENT SYSTEM COMPRISING AN INTEGRATED POWER OSCILLATOR

FIELD

The present disclosure relates generally to plasma ash systems, and more particularly to a plasma abatement system located downstream of a semiconductor workpiece processing chamber.

BACKGROUND

Integrated chips are formed by complex fabrication methods during which a workpiece is subjected to a plurality of different processes. Typically, the processes may include photolithography, implantations, etches, depositions, etc. For example, in a typical photolithography process, a surface of a semiconductor wafer is covered with a light sensitive (e.g., UV sensitive) photoresist material that is exposed and subsequently developed to selectively mask certain areas of the wafer. Unmasked areas of the wafer may then be processed (e.g., unmasked areas of the wafer may be selectively etched to pattern a layer underlying the photoresist) in a processing chamber. Once processing is completed, the photoresist material may be removed by an ashing process that utilizes a mixture of reactive gases, such as atomic oxygen, to remove the photoresist from the surface of the wafer.

The ashing process results in an effluent byproduct, having photoresist material, which is then removed from the processing chamber. If the effluent material is volatile, it is typically exhausted through scrubbing machines. However, under some resist removal conditions (such as oxygen-free plasma ashing) the photoresist effluent remains solid, and is effectively sublimated off the wafer. In such a case the solids entrained in the chamber exhaust tend to condense on any cold surface, such as the processing chamber walls, exhaust pipes, downstream valves (isolation and/or throttle), or even the large vacuum pumps.

In order to eliminate effluent buildup in the processing chamber, the processing chamber walls are typically heated above a certain temperature. While this prevents condensation in the chamber, it simply moves the condensate downstream to coat other components, preventing proper operation of valves and pumps. In order to minimize effects of this solid effluent, abatement systems using radio-frequency (RF) powered inductively coupled plasma sources may be configured downstream of the chamber to generate an abatement plasma that 'burns' away the effluent. FIG. 1 illustrates a typical downstream plasma ignition system. As shown in FIG. 1, a typical plasma ignition system 100 comprises a plasma chamber 102 inductively coupled to a commercially available RF power supply 104. The RF power supply 104 is configured to generate an RF signal operating at a set frequency (e.g., 13.56 MHz). Energy is transmitted from the RF power supply 104, via an antenna 110, to a plasma chamber 102, resulting in the ignition of an abatement plasma 108 when sufficient power has been delivered to the plasma chamber 102. Because the RF power supply 104 operates at an output power having an output impedance (e.g., 50 ohms) that rarely matches the load of the abatement plasma, a matching network 106 is configured to match the output impedance of the RF power supply 104 to a complex impedance established by the antenna 110 and abatement plasma load (i.e., the impedance of the plasma 108), thereby efficiently coupling power from the RF signal, generated by the RF power supply 104, into the abatement plasma 108.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to the more detailed description that is presented later.

The present disclosure is directed towards a method and apparatus for generating an abatement plasma downstream of a processing chamber using an integrated power oscillator circuit driven by feedback based upon a load of the abatement plasma. In one embodiment, a plasma ashing system includes an abatement system configured to receive an ashing effluent byproduct from an upstream processing chamber containing a workpiece. The ashing effluent byproduct is provided along an exhaust conduit to a downstream afterburner unit configured to generate an abatement plasma that volatilizes the ashing effluent. The afterburner unit comprises an integrated power oscillator having an oscillating circuit operatively coupled to an antenna configured to ignite and sustain the abatement plasma within a plasma containment vessel in direct communication with the exhaust conduit. The antenna, together with the plasma load, forms a resonant tank circuit, which provides a feedback that drives operation of the oscillating circuit (e.g., varies frequency and/or current). Accordingly, because the resonant tank circuit of the integrated power oscillator comprises the load of the abatement plasma, the oscillating circuit is able to vary its output based upon changes in the load of the abatement plasma, resulting in an automatic and almost instantaneous adjustment to oscillating circuit output.

To the accomplishment of the foregoing and related ends, the following description and annexed drawings set forth in detail certain illustrative aspects and implementations of the disclosure. These are indicative of but a few of the various ways in which the principles of the disclosure may be employed. Other aspects, advantages and novel features of the disclosure will become apparent from the following detailed description of the disclosure when considered in conjunction with the drawings.

DETAILED DESCRIPTION

Figure 1:
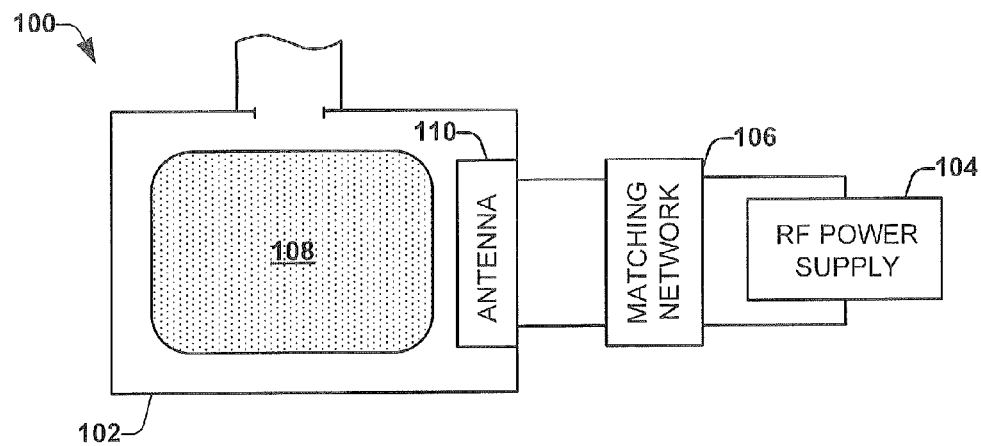
FIG. 1 illustrates a block diagram of an exemplary plasma ignition system having an afterburner assembly comprising a RF power source and matching network.

The disclosure will now be described with reference to the drawings wherein like reference numerals are used to refer to like elements throughout. The illustrations and following descriptions are exemplary in nature, and not limiting. Thus, it will be appreciated that variants of the illustrated systems and methods and other such implementations apart from those illustrated herein are deemed as falling within the scope of the present disclosure and the appended claims.

In some instances, semiconductor manufacturing process systems may comprise downstream abatement systems configured to remove effluent byproducts resulting from a semiconductor process. Such downstream abatement systems prevent a buildup of processing waste, which may necessitate frequent replacement of equipment components. Downstream abatement systems typically comprise afterburner units having an RF power supply that is configured to generate an abatement plasma based upon one or more different plasma chemistries. Because the RF power supply operates at an output power having an output impedance (e.g., 50 ohms) that rarely matches the load of the abatement plasma, a matching network (e.g., as illustrated in FIG. 1) is placed between the power supply and the load. This matching network often has to be adjusted in order to allow for power to be efficiently coupled to plasmas generated from different plasma chemistries or different effluents. For example, during a process utilizing multiple plasma chemistries a matching network may have to be adjusted for each change in the chemistry so as to prevent power loss in the transmission line between the RF power supply and the abatement plasma. More significantly, by matching the load and supply impedances, the matching network enables maximum power transfer from the supply to the plasma load, thereby enabling optimal abatement. Without the matching it is very likely that the abatement would be partial at best.

Such adjustment to a matching network can be done by manually adjusting the matching network or by using auto-tuners to adjust the matching network. However, the inventors have appreciated that either such method of adjustment has a number of drawbacks. For example, auto-tuners are expensive, consume large amounts of valuable space in the process module, and may take up to several seconds to execute changes in the matching network. Similarly, manual adjustment of a matching network can be prohibitively time consuming and cumbersome if plasma chemistries are changed often. Accordingly, the inventors have appreciated that an integrated power oscillator circuit, as described herein, may be used to generate and automatically tune an abatement plasma, based upon one or more plasma chemistries, in an afterburner unit located downstream of a processing chamber.

For example, in one embodiment, a plasma ashing system comprises an abatement system configured to receive ashing effluent from an upstream processing chamber housing a workpiece, and to generate an abatement plasma that abates the received ashing effluent using an RF plasma ignited and sustained with an integrated power oscillator circuit. In particular, the ashing effluent is provided along an exhaust conduit, in direct communication with the processing chamber, to an afterburner unit that comprises a fully auto-tuned integrated power oscillator. The integrated power oscillator comprises an oscillating circuit operatively coupled to an antenna that is configured to ignite and sustain an abatement plasma within a plasma containment vessel in fluid communication with the exhaust conduit. The antenna and abatement plasma load act as a resonant tank circuit, which the oscillating circuit drives to ignite and maintain the abatement plasma. The resonant tank circuit is further configured to provide a feedback that drives operation of the oscillating circuit (e.g., causes the oscillating circuit to vary its frequency and/or current in response to changes in the resonant tank circuit). Therefore, because the resonant tank circuit of the integrated power oscillator comprises the load of the abatement plasma, the oscillating circuit is able to make automatic and almost instantaneous adjustment to it's output.

Figure 2:
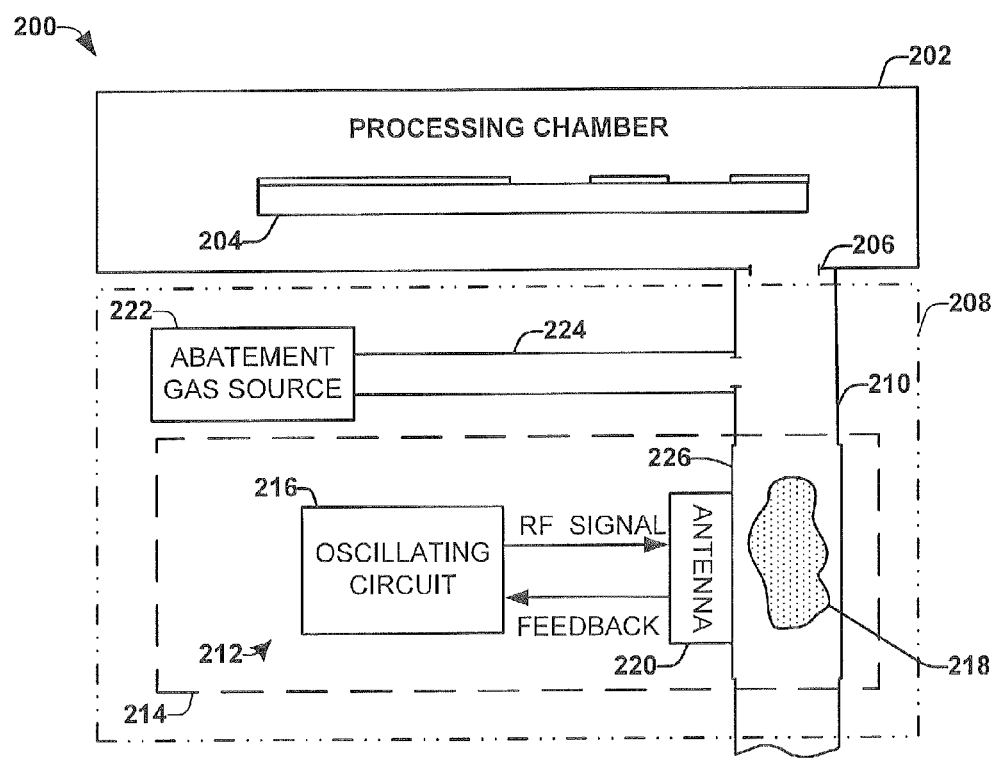
FIG. 2 illustrates a block diagram of an exemplary semiconductor manufacturing processing system having a downstream abatement system comprising an integrated power oscillator (IPO) circuit.

Referring now to the figures, in accordance with one exemplary embodiment of the present invention, FIG. 2 illustrates a block diagram of an exemplary semiconductor manufacturing processing system 200 having a processing chamber 202 coupled to a downstream abatement system 208. The processing chamber is configured to house a workpiece, which may be operated upon by a process that results in one or more effluent byproducts. The downstream abatement system 208 comprises an integrated power oscillator (IPO) circuit 212 configured to generate an abatement plasma 218 used for abatement of the effluent byproducts (e.g., ashing effluent) generated in the separate, upstream processing chamber 202. The IPO 212 further provides for auto-tuning in response to changes in the load of the abatement plasma (abatement plasma load) without any substantial delays, thereby allowing the abatement system 208 to be able to generate and/or maintain an abatement plasma 218 over a wide range of plasma chemistries (e.g., within a single recipe with multiple steps, each step using a different plasma chemistry, or within multiple recipes).

More particularly, the semiconductor manufacturing processing system 200 comprises a processing chamber 202 that may be used for a wide range of processes (e.g., ashing procedures, RIE cleaning, etc.) that result in an effluent byproduct. For example, in an ashing process a primary plasma (e.g., based upon a primarily non-oxidizing plasma chemistry) operates within the processing chamber 202 to remove material from the surface of a workpiece 204 by breaking up the material to form an effluent comprising large molecules that can be sublimated off the surface of the workpiece. It will be appreciated that as provided herein, the term "effluent" may refer to any effluent (e.g., such as plasma byproducts) discharged from a processing chamber 202. For example, effluent may comprise a wide variety of chemical species including organic compounds and/or inorganic compounds. In one particular embodiment, an effluent may comprise photoresist material generated during a specific plasma ashing processing to remove photoresist from a workpiece 204 housed within the processing chamber 202.

In order to prevent effluent condensation on the processing chamber walls 202, the walls are typically heated. The effluent is therefore output from the processing chamber 202 to an exhaust conduit 210 in direct communication with the processing chamber 202 via exhaust aperture 206. The exhaust conduit 210 is in direct communication with an afterburner unit 214 that is comprised within the abatement system 208. The afterburner unit 214 is configured to inductively generate an abatement plasma 218 within a plasma containment vessel 226 in fluid communication with the exhaust conduit 210

(e.g., a plasma containment vessel 226 comprising the exhaust conduit). In one embodiment, the plasma containment vessel 226 may comprise the exhaust conduit 210. In an alternative embodiment, the plasma containment vessel 226 may comprise a vessel separate from, but in direct communication with, the exhaust conduit 210.

The abatement plasma 218 is configured to act upon effluent within the exhaust conduit. When the abatement plasma 218 acts upon the effluent, it changes the effluent, in-situ, to a highly volatile substance (e.g., such as water-vapor or carbon-dioxide) that can be harmlessly removed from the semiconductor manufacturing process system.

The afterburner unit 214 comprises an integrated power oscillator (IPO) 212 configured to ignite the abatement plasma 218 within the afterburner unit 214 by generating and delivering sufficient power to the plasma in the containment vessel 226. The IPO 212 comprises a positive feedback circuit, in which changes in the load of the abatement plasma 218 provide for a feedback that automatically adjusts operation of the IPO 212 to efficiently maintain the abatement plasma 218 over a wide range of plasma loads (e.g., plasma chemistries).

In one embodiment, an abatement gas source 222 may be configured to provide an abatement gas that may reside within the plasma containment vessel 226, where it is ignited by the IPO 212 to form the abatement plasma 218. In one embodiment, the abatement gas may be provided to the exhaust conduit 210 at a gas inlet 224 located upstream of the afterburner unit 214, but downstream of the processing chamber 202. In one embodiment, an abatement gas comprising oxygen may be used to generate an abatement plasma 218 that acts to remove organic ashing effluent from the exhaust conduit 210.

In one embodiment, the integrated power oscillator (IPO) comprises an oscillating circuit 216 that provides an oscillating RF signal to an antenna 220 configured to ignite the abatement plasma 218. The antenna 220 and load of the abatement plasma 218 are networked with components of the IPO 212 to act as a resonant tank circuit, which is driven by the oscillating signal and that provides a feedback to the oscillating circuit 216. The feedback dictates operation of the oscillating circuit 216 so that when changes to the load of the abatement plasma 218 occur, operation of the oscillating circuit 216 is adjusted to output an RF signal to the antenna 220 that maintains the abatement plasma 218. For example, if the load of the abatement plasma 218 changes, feedback is provided from the resonant tank circuit that causes the oscillating circuit 216 to respond by changing the frequency of operation or the current draw of a DC current supply that powers the oscillating circuit 216, thereby almost immediately (e.g., within milliseconds) allowing the IPO 212 to generate an RF signal that responds to changes in the plasma load. Therefore, in contrast to traditional matching networks (e.g., which are constantly changed to match the constant 50 Ohms output impedance of off-the-shelf RF power supplies operating at 13.56 MHz, as shown in FIG. 1), the IPO 212 automatically adjusts to changes in the plasma load without the need of an external matching network. Therefore, the IPO 212 quickly and easily adjusts to the use of different chemistries (e.g., in different steps of a process).

Figure 3:
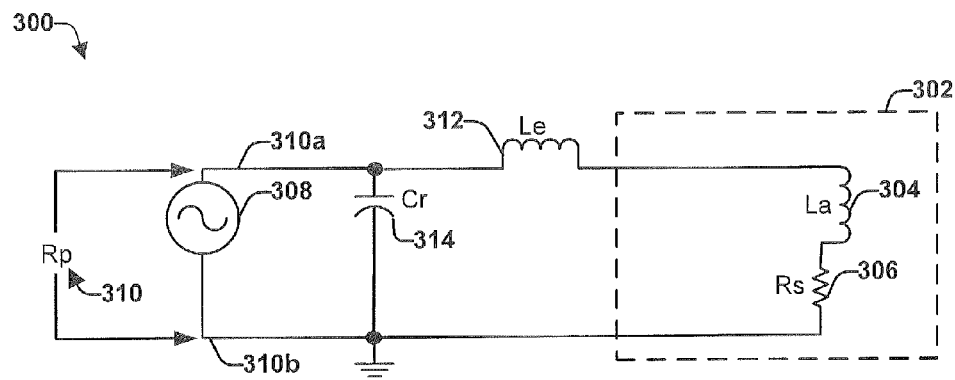
FIG. 3 is a circuit diagram of an integrated power oscillator (IPO) circuit.

FIG. 3 illustrates a circuit diagram of an integrated power oscillator (IPO) circuit 300 as provided herein. As shown in the IPO circuit 300, the integrated power oscillator comprises a resonant tank circuit 302 coupled to an oscillator 308.

The resonant tank circuit 302 is comprised of an antenna and a plasma load. As shown in the IPO circuit 300, the antenna is modeled as part of a reactive component (illustrated by inductance La 304), while plasma load (e.g., including output tank circuit dissipation) is modeled as a resistive component (resistance Rs 306). The value of the resistance Rs 306 may depend on factors including but not limited to antenna design, implant species, gas pressure and plasma density, and is generally in the range of about 0.5 to 2 ohms. The unloaded (no plasma) value of resistance Rs 306 may be approximately 0.1 ohms.

The oscillator 308 is configured to operate in response to changes in the resonant tank circuit 302. For example, if the reactive component (corresponding to inductance La 304 and capacitor Cr) of the plasma load changes, the oscillator 308 may modify its operating frequency in response to the changes. Similarly, if the resistive component (resistance Rs 306) of the plasma load changes, the oscillator 308 may make changes in a DC current driving the oscillator 308 in response to the changes. As shown in FIG. 3, changes in the resonant tank circuit 302 are illustrated as depending upon a resonant resistance Rp 310 that may depend on antenna design, neutral gas species and pressure, and plasma conditions, and may be adjusted by choice of an inductance Le 312 external to the antenna (e.g., $Rp=(1+Q^2)*Rs$, wherein $Q=2\pi f(La+Le)/Rs$). Therefore, the oscillator's dependence upon La 304 and Rs 306 allow the oscillator 308 to automatically adjust itself (e.g., in less than about 1 millisecond) to operate over a wide range of plasma chemistries (e.g., a wide range of resistances, Rs 304).

In one embodiment, an output tank circuit capacitance Cr 314, comprising one or more capacitors, may be selected to set the oscillation frequency of the oscillator 308 (e.g., to approximately 13.56 MHz). For example, based upon inductances La and Le, the approximate operating frequency, f, can be chosen by setting the value of $Cr=[(2\pi f)^2*(La+Le)]^{-1}$. Accordingly, a capacitance Cr 314 may be chosen to allow the oscillator 308 to operate within a frequency range that spans inductances cause by plasma reactive effects (e.g., which may decrease the value of La by about 20% from no load conditions to maximum power, causing the tank resonant frequency to increase by about 10%), without adjustment.

Figure 4:
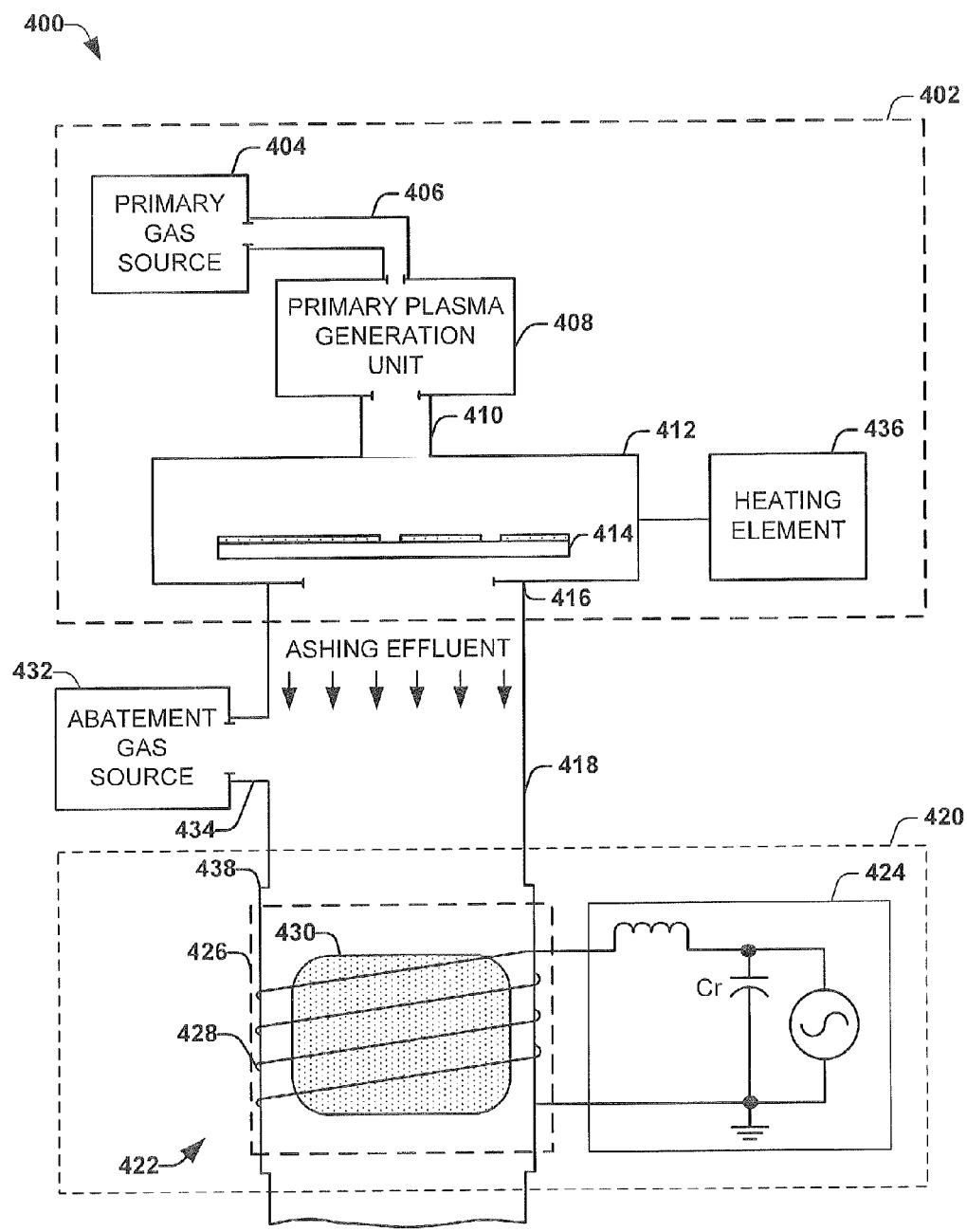
FIG. 4 illustrates a block diagram of an exemplary plasma ashing system with an abatement system having an afterburner comprising an integrated power oscillator (IPO).

FIG. 4 illustrates a block diagram 400 of an exemplary plasma ashing system with an abatement system having an afterburner unit 420 comprising an integrated power oscillator (IPO) 422 configured to support a wide range of abatement plasma chemistries.

As illustrated in FIG. 4, a processing unit 402 comprises a primary plasma generation unit 408 in direct communication with a processing chamber 412. The primary plasma generation unit 408 is configured to receive a primary gas from a primary gas source 404 by way of a primary gas inlet 406. The primary plasma generation unit 408 generates a primary plasma based upon the primary gas (e.g., by RF inductive plasma coupling, or microwave coupling). In one embodiment, the primary gas may comprise a primarily non-oxidizing (i.e. oxygen free) plasma chemistry. The primary plasma enters into the processing chamber 412, by way of a plasma inlet 410, and operates within the processing chamber 412 to remove material (e.g., organic material such as photoresist) from the surface of a workpiece 414 housed within the processing chamber 412. Under primarily non-oxidizing plasma exposure, removal of material from the workpiece 414 results in an ashing effluent comprising large molecules that are sublimated off the surface of the workpiece 414. In one embodiment, a heating element 436 is coupled to the processing chamber 412 and is configured to regulate the temperature of one or more walls of the processing chamber 412 at a temperature sufficient to prevent condensation of the ashing effluent on the processing chamber walls.

The ashing effluent flows into an exhaust conduit 418 in direct communication with the processing chamber 412 via an exhaust aperture 416. As illustrated in FIG. 4, the exhaust aperture 416 is located on the bottom wall of the processing chamber 412, however, one of ordinary skill in the art will appreciate that the exhaust aperture 416 may be located at any position within the processing chamber 412. In one embodiment, the processing chamber 412 may be held at a higher pressure than the exhaust conduit 418, causing a pressure imbalance that draws the ashing effluent from the processing chamber 412 into the exhaust conduit 418.

An abatement gas source 432 may be coupled to the exhaust conduit 418 by way of an abatement gas inlet 434, which is configured to introduce an abatement gas (e.g., an oxidizing gas such as oxygen or a combination of gases including oxidizing gases) to a location along the exhaust conduit positioned downstream of the processing chamber 412. In one embodiment, the abatement gas inlet 434 may be located downstream of the processing chamber 412 and upstream the afterburner unit 420 housing an integrated power oscillator (IPO) circuit 422. In another embodiment, the abatement gas inlet 434 is part of the afterburner unit 420.

The IPO 422 comprises a resonant tank circuit 426, consisting of an RF antenna and an abatement plasma load along with other reactive components such as capacitors, which dictates operation of an oscillating circuit 424. In one embodiment, the RF antenna comprises a conductive coil 428 formed from a conductive wire or tube that extends from an oscillating circuit 424 to a position operatively coupled to the plasma and/or abatement gas. The RF antenna may be configured to inductively transfer power from the oscillating circuit 424 to an abatement plasma 430 located within a plasma containment vessel 438 (e.g., comprising the exhaust conduit 418). In one embodiment, the conductive coil 428 may be wrapped around an exterior of a plasma containment vessel 438 (e.g., comprising exhaust conduit 418) for a plurality of n turns. In an alternative embodiment, the conductive coil 428 may be comprised within the interior of the plasma containment vessel 438 (e.g., comprising exhaust conduit 418). The oscillating circuit 424 is configured to provide an RF signal to the conductive coil 428, which inductively transfers power from the oscillating circuit 424 to a gas mixture within the plasma containment vessel 438 (e.g., comprising an oxygen containing abatement gas and ashing effluent), resulting in the inductive formation of an abatement plasma 430 within the plasma containment vessel 438 (e.g., comprising exhaust conduit 418).

It will be appreciated that while the abatement plasma 430 is shown in FIG. 4 as being generated within a plasma containment vessel 438 comprising the exhaust conduit 418 that this is a non-limiting embodiment. In alternative embodiments, the abatement plasma 430 may be generated by the integrated power oscillator 422 in a separate plasma containment vessel 438 located external to and in direct communication with the exhaust conduit 418. Therefore, in general, the abatement gas may be provided to a variety of locations within the abatement system, which are operatively coupled to the antenna of the integrated power oscillator 422 (e.g., which allows the antenna of the IPO to operate upon the abatement gas to ignite an abatement plasma).

Figure 5A:
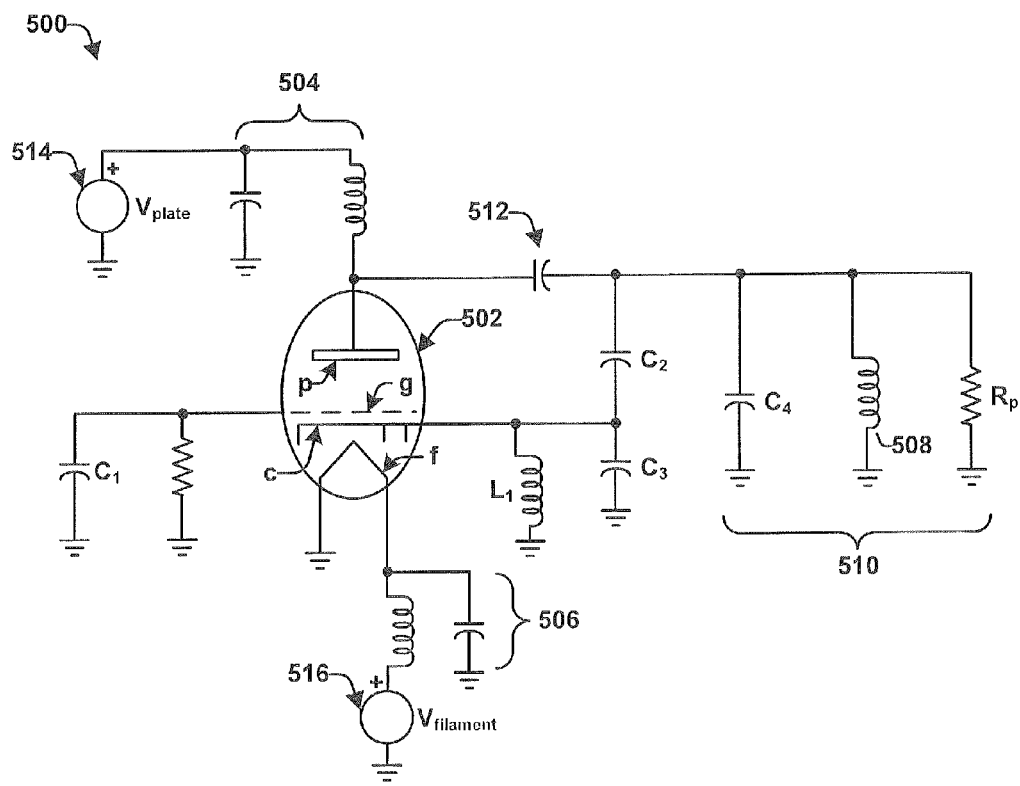
FIG. 5a illustrates a more detailed circuit diagram of an exemplary oscillator circuit for providing plasma ignition and maintenance in accordance with the present invention.

FIG. 5a illustrates a more detailed circuit diagram of an exemplary integrated power oscillator circuit 500 configured to provide plasma ignition and maintenance in accordance with the present invention. It will be appreciated that the components illustrated within the circuit diagram illustrate a non-limiting example of an oscillating circuit. For example, the components (e.g., capacitors, resistors, inductors) illustrated in the integrated power oscillator circuit 500 may represent one or more physical circuit components. For example, capacitances C1-C4 may each represent one or more physical capacitors (e.g., standard, low-cost, fixed-value RF transmitting capacitors, for example).

Figure 5B:
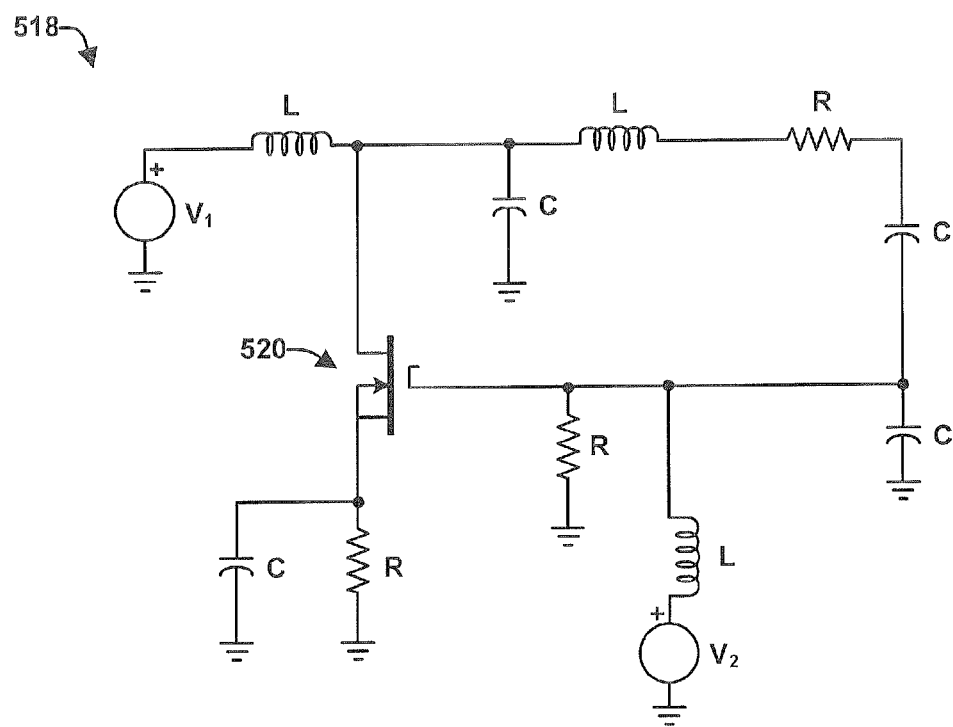
FIG. 5*b* illustrates an alternative circuit diagram of an exemplary oscillator circuit comprising a solid state RF power transistor.

Referring to FIG. 5a, a vacuum tube comprising a triode tube 502 is configured in a grounded-grid configuration. The grid (g) of the triode tube 502 is RF ground through capacitor $C_1$. The DC power supplies of the plate (p) and filament (f) are protected from RF by properly designed chokes, 504 and 506 respectively. A filament power source 516 is configured to provide power to a heater filament (f) of the triode tube. Capacitors $C_2$ and $C_3$ constitute a "capacitor-divider" of a Colpitts oscillator and control how much feedback is coming back to the cathode (c), which is itself DC ground through the inductor $L_1$. The capacitor $C_4$, the load coil 508, and the plasma resistive load $R_p$ form the resonant tank circuit 510. Capacitor 512 is coupled to the resonant tank circuit 510 to provide AC coupling for the triode tube 502 and feedback. At start, when power is applied to the plate (p), the resonant tank circuit 510 picks up one frequency out of white noise that is initially transmitted out of the triode tube 502. This frequency is fed back to the cathode (c), and amplified, setting up oscillations at the one frequency. If the plasma load $R_p$ changes, the resonance of the resonant tank circuit 510 is modified and a different frequency is selected for amplification. More specifically, reactive changes in the plasma load $R_p$ change the frequency of operation, whereas resistive changes in the load typically change the current drawn from the DC plate (i.e., anode) power supply 514. It will be appreciated that in alternative embodiments, a solid state oscillator may be used in place of vacuum tube 502, as shown in the circuit diagram 518 of FIG. 5b. The solid state oscillator may comprise one or more solid state components 520 that are configured to have substantially equivalent operating characteristics to vacuum tube 502. Accordingly, the integrated power oscillator circuit 500 improves plasma ignition and proper repeatability, since changes caused by plasma impedance effects are accommodated by a feedback circuit containing capacitors $C_2$ and $C_3$. Moreover, system ignition time is substantially improved since tuning of a load matching network is no longer required. Still further, system costs are reduced and system reliability improved by eliminating power components such as controls, power meters, cables, matching networks, and motor drives associated with conventional systems which use motorized variable vacuum capacitors.

Figure 6:
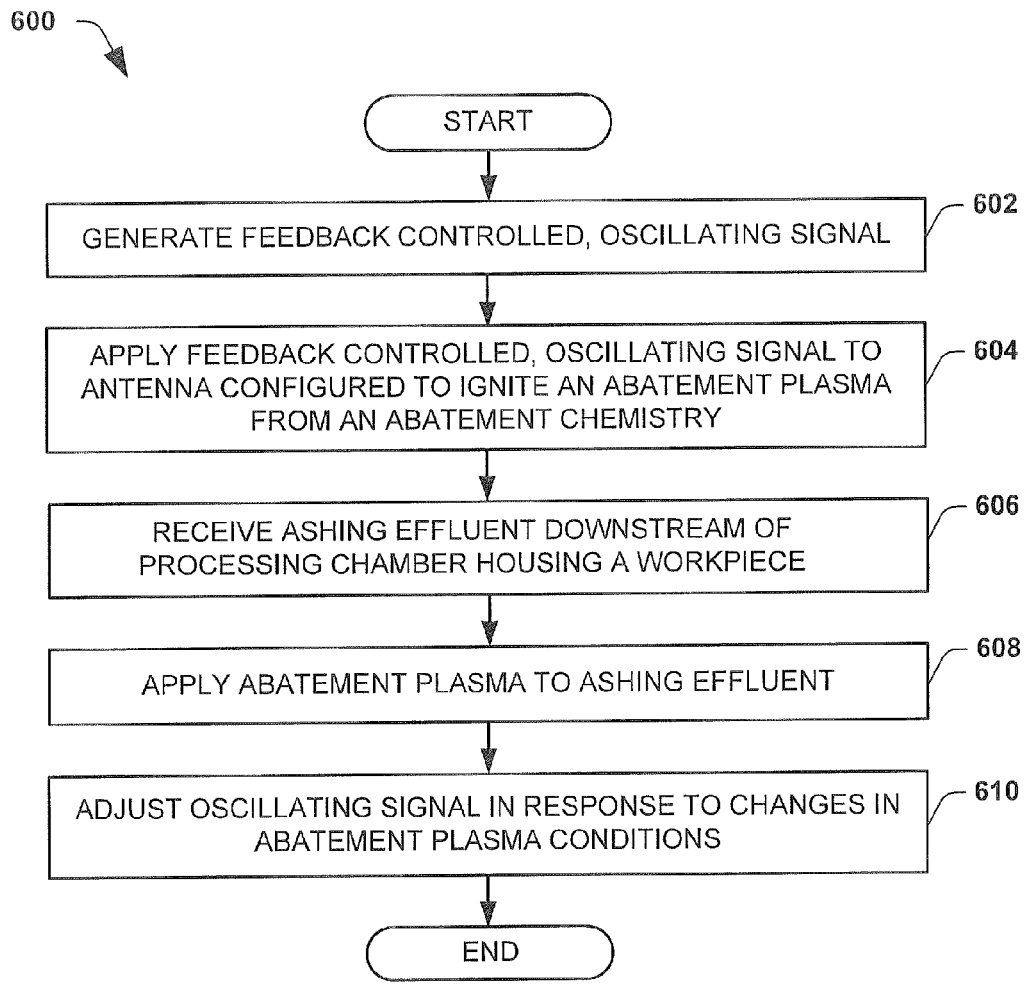
FIG. 6 is a flow chart illustrating an exemplary method for performing abatement of semiconductor processing effluent using a wide range of abatement chemistries.
Figure 7:
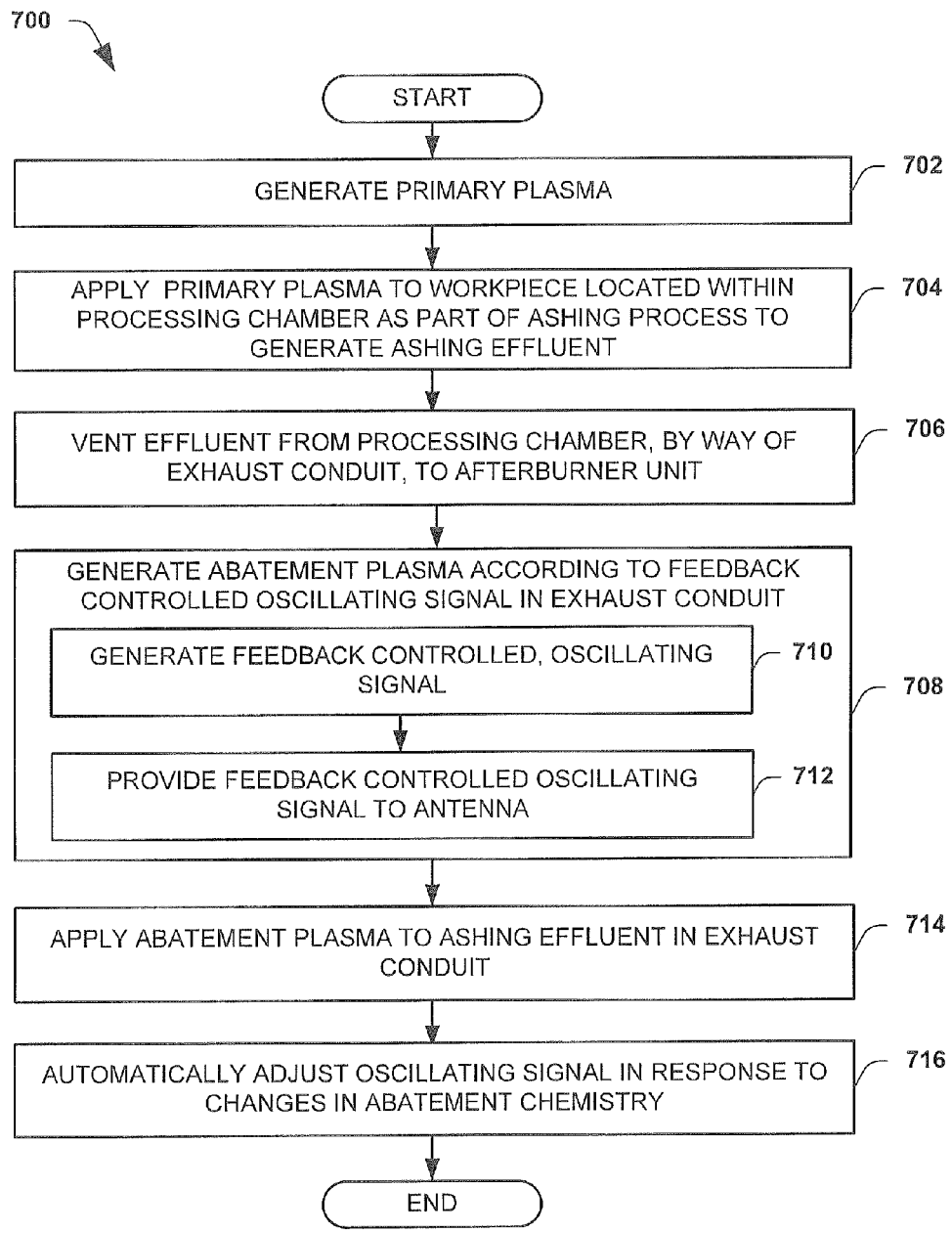
FIG. 7 is a flow chart illustrating an exemplary ashing procedure comprising downstream abatement of ashing effluent.

FIGS. 6 and 7 illustrate flow charts 600 and 700 showing methods for generating an abatement plasma downstream. While these methods 600 and 700 are illustrated and described below as a series of acts or events, the present disclosure is not limited by the illustrated ordering of such acts or events, For example, some acts may occur in different orders and/or concurrently with other acts or events apart from those illustrated and/or described herein. In addition, not all illustrated acts are required. Further, one or more of the acts depicted herein may be carried out in one or more separate acts or phases.

FIG. 6 is a flow chart illustrating an exemplary method 600 for performing abatement of semiconductor processing effluent using a wide range of abatement chemistries.

At 602 a feedback controlled, oscillating signal is generated. The feedback controlled, oscillating signal is generated because of the selectivity of the tank circuit's behavior as a highly selective band-pass filter, in order to create oscillations appropriate for ignition and sustenance of a plasma.

At 604, the feedback controlled, oscillating signal is provided to an antenna configured to ignite an abatement plasma from an abatement chemistry. In one embodiment, the antenna may comprise a conductive coil, such that the received feedback controlled, oscillating signal causes a time varying magnetic field to be induced inside of the antenna, which induces an equivalent time varying current within the plasma enclosure, and transfers energy to an abatement chemistry. When sufficient power has been delivered to the abatement chemistry, and other operating conditions such as appropriate gas mixture and gas pressure have been achieved, the abatement plasma is ignited. In one embodiment, the abatement chemistry may comprise an oxidizing chemistry, for example.

The antenna and plasma collectively form a resonant tank circuit. The resonant tank circuit is configured to provide feedback based upon changes in abatement plasma conditions (e.g., due to changes in the abatement chemistry).

At 606 an effluent byproduct is received at a location downstream of a processing chamber housing a workpiece. In one embodiment the effluent byproduct may be generated by the removal of material (e.g., photoresist) from the workpiece. Once removed, the effluent is pumped to a location downstream of the processing chamber.

At 608 the abatement plasma is applied to the effluent. The abatement plasma causes the effluent to be reduced, in-situ, to volatile gases such as water-vapor or carbon-dioxide, for example. In one embodiment the abatement plasma may be chosen to comprise an oxidizing chemistry, which is configured to perform abatement of photoresist effluent.

At 610 the feedback controlled, oscillating signal is automatically adjusted in response to changes in the abatement plasma conditions. The abatement plasma conditions may comprise the plasma load, for example. In one embodiment, the feedback controlled, oscillating signal may be adjusted in response to feedback received from the resonant tank circuit. By automatically adjusting the oscillating signal in response to changes in the abatement plasma conditions (e.g., feedback), the oscillating signal can be automatically adjusted over a broad range of plasma chemistries.

FIG. 7 is a flow chart illustrating an exemplary ashing procedure 700 comprising downstream abatement of ashing effluent.

At 702 a primary plasma is generated. In one embodiment, the primary plasma may be generated by RF inductive coupling or microwave coupling to a primary plasma chemistry. In one embodiment, the primary plasma chemistry may comprise a primarily non-oxidizing (e.g., oxygen free) plasma chemistry.

At 704 the primary plasma is applied to a workpiece located within a processing chamber as part of an ashing process. The primary plasma acts upon a material (e.g., photoresist) on the surface of the workpiece to remove the material as part of the ashing process. The ashing process results in an ashing effluent byproduct, for example, containing long-chain polymers of photoresist.

At 706 effluent from the ashing process is vented from the processing chamber by way of an exhaust conduit to a downstream abatement system. In one embodiment, the abatement system comprises an afterburner unit configured to receive the ashing effluent.

At 708 an abatement plasma is generated according to a feedback controlled, oscillating signal. In particular, at 710 the oscillating signal may be generated by an oscillating circuit. At 712 the oscillating signal is provided to an antenna that is configured to inductively transfer energy to an abatement chemistry. Collectively, the abatement plasma and the antenna form a resonant tank circuit that controls the oscillating signal through a feedback process (as described below in step 716) that response to changes in conditions of the abatement plasma (e.g., changes in the plasma load).

At 714 the abatement plasma is applied to ashing effluent in the exhaust conduit. As described above, the abatement plasma acts upon the effluent to remove it from the exhaust conduit.

At 716 the oscillating signal is automatically adjusted in response to a feedback provided from the resonant tank circuit. The feedback allows changes in the load of the abatement plasma to drive changes in the oscillating signal, thereby automatically adjusting the oscillating signal to maintain the abatement plasma in changing plasma load conditions.

Although the disclosure has been illustrated and described above with respect to certain aspects and implementations, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (i.e., that is functionally equivalent), even though not structurally equivalent to the disclosed structure, which performs the function in the herein illustrated exemplary implementations of the disclosure. In this regard, it will also be recognized that the disclosure may include a computer-readable medium having computer-executable instructions for performing the steps of the various methods of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "including", "has", "having", "with" and variants thereof are used in either the detailed description or the claims, these terms are intended to be inclusive in a manner similar to the term "comprising". Also, the term "exemplary" as utilized herein simply means example, rather than finest performer.

What is claimed is:

1. A semiconductor manufacturing processing system, comprising:

a processing chamber configured to house a workpiece that is operated upon by a process that results in an effluent byproduct, wherein the semiconductor manufacturing processing system comprises a plasma ashing system configured to remove material from a surface of the workpiece;

an exhaust conduit in direct communication with the processing chamber and configured to receive the effluent byproduct evacuated from the processing chamber to a downstream abatement system; and an afterburner unit comprised within the downstream abatement system and in direct communication with the exhaust conduit, wherein the afterburner unit is configured to generate an abatement plasma that is used to remove the effluent byproduct from the exhaust conduit at a location downstream of the processing chamber, the afterburner unit comprising:

an oscillating circuit comprising a triode tube comprising a grid coupled to ground through a first capacitor, a plate coupled to a resonant tank circuit and to a first power supply by way of a first choke, a cathode coupled to the resonant tank circuit, and a filament coupled to a second power supply by way of a second choke, wherein the oscillating circuit is configured to generate an oscillating signal;

an antenna driven by the oscillating signal to inductively ignite and maintain the abatement plasma, wherein the abatement plasma and antenna are part of the resonant tank circuit that is driven by the oscillating signal and that is configured to provide feedback to the oscillating circuit based upon changes in the abatement plasma, and wherein the oscillating circuit is configured to adjust its operating current and frequency of operation in response to the feedback.

2. The system of claim 1, wherein the oscillating circuit is configured to adjust its operating current and frequency of operation to accommodate a plurality of abatement plasma chemistries having a wide range of plasma loads.

3. The system of claim 2, wherein resonant tank circuit comprises an reactive component and a resistive component, wherein the oscillating circuit comprises an power supply configured to provide a DC current that varies in response to changes in the resistive component, and wherein the oscillating circuit varies the frequency of the oscillating signal in response to changes in the reactive component.

4. The system of claim 3, wherein the antenna comprises a conductive coil wrapped around an exterior of a plasma containment vessel in fluid communication with the exhaust conduit and is configured to inductively transfer power from the oscillating circuit to the abatement plasma.

5. The system of claim 3, wherein the oscillating circuit comprises:

a vacuum tube or a solid state component, configured to output the oscillating signal from the oscillating circuit, and further configured to receive a positive feedback from the resonant tank circuit that provides for a selection of the oscillating signal output from the vacuum tube or the solid state component and thereby sustains oscillation at a specific frequency, and monitors and adjusts for changes in the abatement plasma.

6. The system of claim 5, wherein the oscillating circuit further comprises a filament power source configured to provide power to a heater filament of the vacuum tube.

7. The system of claim 1, wherein the plasma ashing system comprises:

a primary gas source configured to provide a primary gas to a primary plasma generation unit that generates a primary plasma from the primary gas, wherein the primary plasma is applied to the workpiece housed within the processing chamber.

wherein the primary plasma is generated from a primarily non-oxidizing plasma chemistry and wherein the abatement plasma is generated from an oxidizing plasma chemistry.

8. The system of claim 1, further comprising a heating element coupled to the processing chamber and configured to regulate a temperature of one or more processing chamber walls.

9. A downstream RF plasma generation system, comprising:

a plasma containment vessel in fluid communication with an exhaust conduit that is in direct communication with a processing chamber configured to house a workpiece, wherein processing of the workpiece results in an effluent byproduct that is evacuated through the exhaust conduit to a downstream abatement system; and an afterburner unit comprised within the downstream abatement system and configured to generate an abatement plasma within the plasma containment vessel, which is used to remove the effluent byproduct from the exhaust conduit at a location downstream of the processing chamber, the afterburner unit comprising:

an integrated power oscillator comprising a triode tube having a grid coupled to ground through a first capacitor, a plate coupled to a resonant tank circuit and to a first power supply by way of a first choke, a cathode coupled to the resonant tank circuit, and a filament coupled to a second power supply by way of a second choke, wherein the integrated power oscillator is configured to receive a DC current provided from a power supply and to provide an oscillating signal having a frequency to an antenna that ignites and maintains the abatement plasma within the afterburner unit, wherein the plasma and antenna are part of the integrated power oscillator and form the resonant tank circuit, and wherein the integrated power oscillator is configured to adjust the DC current and the frequency of the oscillating signal in response to changes in the abatement plasma.

10. The system of claim 9, wherein resonant tank circuit comprises an reactive component corresponding to the antenna and an appropriately sized capacitor, and a resistive component corresponding to a load of the abatement plasma, wherein the power supply is configured to provide the DC current that varies in response to changes in the resistive component, and wherein the integrated power oscillator varies the frequency of the oscillating signal in response to changes in the reactive component.

11. The system of claim 9, wherein the abatement plasma is generated from an oxidizing plasma chemistry, and wherein a primary plasma generated from a primary gas having a primarily non-oxidizing plasma chemistry is configured to act upon the workpiece in the processing chamber.

12. The system of claim 9, wherein the antenna comprises a conductive coil wrapped around the exterior of the plasma containment vessel in fluid communication with the exhaust conduit and is configured to inductively transfer power from the integrated power oscillator to the abatement plasma.

13. The system of claim 9, further comprising an abatement gas inlet in direct communication with the exhaust conduit at a location between the processing chamber and the afterburner unit.

14. The system of claim 9, wherein the integrated power oscillator is configured to adjust its operating current and frequency of operation to accommodate a plurality of abatement plasma chemistries resulting in a wide range of plasma loads.

15. The system of claim 1, a primary plasma generation unit configured to receive a primary gas from a primary gas source by way of a primary gas inlet, to generate a primary plasma from the primary gas, and to provide the primary plasma to the processing chamber by way of a plasma inlet coupled to the processing chamber.

16. The system of claim 1, further comprising a heating element coupled to the processing chamber and configured to regulate a temperature of a plurality of walls of the processing chamber.

17. A semiconductor manufacturing processing system, comprising:
- a processing chamber configured to house a workpiece;
- a primary plasma generation unit configured to receive a primary gas from a primary gas source by way of a primary gas inlet, to generate a primary plasma from the primary gas, and to provide the primary plasma to the processing chamber by way of a plasma inlet coupled to the processing chamber, wherein the primary plasma is configured to remove material from a surface of the workpiece as an effluent byproduct;
- an exhaust conduit in direct communication with the processing chamber and configured to receive the effluent byproduct evacuated from the processing chamber to a downstream abatement system; and
- an afterburner unit comprised within the downstream abatement system and in direct communication with the exhaust conduit, the afterburner unit comprising:
  - an oscillating circuit comprising a triode tube having a grid coupled to ground through a first capacitor, a plate coupled to a resonant tank circuit and to a first power supply by way of a first choke, a cathode coupled to the resonant tank circuit, and a filament coupled to a second power supply by way of a second choke, wherein the oscillating circuit is configured to generate an oscillating signal;
  - an antenna driven by the oscillating signal to inductively ignite and maintain an abatement plasma,
  - wherein the abatement plasma and antenna are part of the resonant tank circuit that is driven by the oscillating signal and that is configured to provide feedback to the oscillating circuit based upon changes in the abatement plasma, and
  - wherein the oscillating circuit is configured to adjust its operating current and frequency of operation in response to the feedback.

18. The system of claim 17, further comprising a heating element coupled to the processing chamber and configured to regulate a temperature of a plurality of walls of the processing chamber.

* * * * *